United States Patent
Yamaguchi et al.

(10) Patent No.: US 6,271,110 B1
(45) Date of Patent: *Aug. 7, 2001

(54) BUMP-FORMING METHOD USING TWO PLATES AND ELECTRONIC DEVICE

(75) Inventors: Ichiro Yamaguchi; Koki Otake; Masahiro Yoshikawa, all of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/118,064

(22) Filed: Jul. 17, 1998

Related U.S. Application Data

(63) Continuation-in-part of application No. 08/516,284, filed on Aug. 17, 1995, now Pat. No. 6,025,258, which is a continuation-in-part of application No. 08/374,429, filed on Jan. 19, 1995, now abandoned, which is a continuation-in-part of application No. 08/547,532, filed on Oct. 24, 1995, now Pat. No. 5,643,831, which is a continuation-in-part of application No. 08/659,356, filed on Jun. 6, 1996.

(30) Foreign Application Priority Data

| Jan. 20, 1994 | (JP) | 6-004751 |
| Jun. 13, 1995 | (JP) | 7-145962 |
| Apr. 30, 1998 | (JP) | 10-120399 |
| May 13, 1998 | (JP) | 10-130331 |

(51) Int. Cl.[7] .................................. H01L 21/44

(52) U.S. Cl. ............... 438/613; 438/108; 228/180.22

(58) Field of Search ....................... 438/613, 614, 438/615, 616, 106, 108; 257/738, 777, 778, 779, 780; 164/47; 228/180.22, 56.3

(56) References Cited

U.S. PATENT DOCUMENTS

| 3,458,925 | 8/1969 | Napier et al. | 228/180.22 |
| 5,136,363 | 8/1992 | Endo et al. | 257/738 |
| 5,208,186 | 5/1993 | Mathew | 438/613 |

(List continued on next page.)

FOREIGN PATENT DOCUMENTS

| 242 908 | 2/1987 | (DE) . |
| 53-3980 | 2/1978 | (JP) . |
| 62-25435 | 2/1987 | (JP) . |
| 63-289824 | 11/1988 | (JP) . |
| 1-308037 | 12/1989 | (JP) . |
| 2-026030 A | 1/1990 | (JP) . |
| 4-14834 | 1/1992 | (JP) . |
| 4-242943 A | 8/1992 | (JP) . |
| 4-263433 | 9/1992 | (JP) . |
| 4-263434 | 9/1992 | (JP) . |
| 4-264731 | 9/1992 | (JP) . |
| 6-124953 | 5/1994 | (JP) . |
| 8-34001 | 12/1996 | (JP) . |
| 9-270428 | 10/1997 | (JP) . |

OTHER PUBLICATIONS

Japanese Patent Office –Notice of Reasons for Rejection ( Translation) Jan. 30, 2001.

*Primary Examiner*—Olik Chaudhuri
*Assistant Examiner*—Alonzo Chambliss
(74) *Attorney, Agent, or Firm*—Armstrong, Westerman, Hattori, McLeland, & Naughton

(57) ABSTRACT

First and second ball forming plates are prepared. The cavities of the first plate and the cavities of the second plate 20 are filled with solder paste, respectively. The first plate and the second plate are placed in a facing relationship to each other and heated to form metal balls each of which corresponds to the total metal components of the solder paste in one cavity of the first plate and one cavity in the second plate. The metal balls are formed in the cavities of the lower plate 10. The metal balls are transferred from the cavities of the first plate to a device on which bumps are to be formed.

8 Claims, 11 Drawing Sheets

U.S. PATENT DOCUMENTS

| | | | |
|---|---|---|---|
| 5,219,117 | 6/1993 | Lin | 438/613 |
| 5,381,848 | 1/1995 | Trabucco | 164/102 |
| 5,419,806 * | 5/1995 | Huebner | 438/615 |
| 5,607,099 * | 3/1997 | Yeh et al. | 228/180.22 |
| 5,643,831 | 7/1997 | Ochai et al. | 228/108.22 |
| 5,673,846 * | 10/1997 | Gruber | 228/180.22 |
| 5,718,361 * | 2/1998 | Braun et al. | 228/180.22 |
| 5,956,606 * | 9/1999 | Burnette | 438/615 |
| 5,959,346 * | 9/1999 | Ochiai | 257/618 |
| 6,024,275 * | 2/2000 | Takiar | 228/180.22 |
| 6,025,258 * | 2/2000 | Ochiai et al. | 438/613 |
| 6,149,048 * | 11/2000 | Brearley et al. | 228/33 |
| 6,189,772 * | 2/2001 | Hembree | 228/254 |

\* cited by examiner

BUMP-FORMING METHOD USING TWO PLATES AND ELECTRONIC DEVICE

This application is a continuation-in-part application of Ser. No. 08/516,284 filed on Aug. 17, 1995 now U.S. Pat. No. 6,025,258 which is a continuation-in-part of Ser. No. 08/374,429, filed Jan. 19, 1995, now abandoned, which is a continuation-in-part of Ser. No. 081547,532, field Sep. 24, 1995, now U.S. Pat. No. 5,643,831, which is a continuation-in-part of Ser. No. 08/659,356 field Jun. 6, 1996.

BACKGROUND OF THE INVENTION

1. Field of the Invention

The present invention relates to a method of forming metal bumps such as solder bumps or the like and an electronic device having such bumps.

2. Description of the Related Art

In information processing systems for processing vast amounts of information at high speed, LSIs and VLSIs having electronic circuits and electronic parts integrated on a semiconductor chip find wide applications. In order to mount a semiconductor chip having integrated electronic circuits to a ceramic substrate, for example, metal bumps of solder or the like are formed on the semiconductor chip or the ceramic substrate, and the semiconductor chip is mechanically coupled with fixed on and electrically connected to the ceramic substrate, by fusing the solder bumps. For this purpose, it is necessary to form solder bumps on the semiconductor chip or the ceramic substrate or printed circuit board in advance.

Japanese Patent Publications JP-A-7-249631 and JP-A-9-36118 disclose a method of forming solder bumps on an electronic member such as a semiconductor chip, using a bump-forming plate having a plurality of cavities. In this method, a plurality of cavities are formed in the surface of a flat bump-forming plate, the cavities of the bump-forming plate are filled with solder paste by squeegeeing, the bump-forming plate is heated thereby to form the solder balls from the solder paste in the cavities, and the semiconductor chip is moved toward the bump-forming plate thereby to transfer the solder balls from the plate to the semiconductor chip.

As a result of filling the cavities of the bump-forming plate with solder paste by squeegeeing, the surface of the solder paste is flush with the surface of the bump-forming plate, so that a predetermined amount of solder paste is inserted in each of the cavities. The solder component of the solder paste in the cavities of the bump-forming plate is heated and molten, and is rounded by surface tension to form solder balls. Each of the solder balls, while being held in each cavity of the bump-forming plate, has the top thereof protruded upward out of the surface of the bump-forming plate. With the movement of the semiconductor chip toward the bump-forming plate, therefore, electrode pads on the surface of the semiconductor chip come into contact with the tops of the solder balls, with a small gap left between the surface of the semiconductor chip and the surface of the bump-forming plate. In this way, the solder balls can be transferred from the bump-forming plate to the semiconductor chip.

According to this method, the solder bumps are exactly arranged in accordance with the position of the cavities of the bump-forming plate, and solder balls are formed in a uniform size corresponding to the amount of the paste (i.e. the size of each cavity) inserted in the cavities of the plate, thus making it possible to form bumps with high accuracy and low cost. Especially in the case where a bump-forming plate of silicon is used and cavities are formed in the silicon plate by anisotropic etching, a multiplicity of minuscule cavities can be accurately formed at small pitches. This method can thus be suitably used for forming bumps on a semiconductor chip having a high-density wiring at small pitches.

However, the higher the density and hence the smaller the pitches of the wiring of the semiconductor chip, the smaller the solder bumps to be formed, and hence the smaller the extent of the solder ball tops which are protruded from the surface of the bump-forming plate. If a small distortion of the surface of the bump-forming plate or the semiconductor chip exists, a very small proportion of the solder balls are not transferred from the bump-forming plate to the semiconductor chip and may cause a defect.

Also, if the gap between the surface of the semiconductor chip and the surface of the plate becomes smaller at the time of transfer of the solder balls, foreign matters may intrude between the bump-forming plate and the semiconductor chip and may be pressed to the semiconductor chip, with the result that the surface of the semiconductor chip may be damaged or the foreign matters may be undesirably attached to the wiring of the semiconductor chip.

It is therefore desirable to permit the tops of the solder balls to upwardly protrude to a comparatively large measure from the surface of the bump-forming plate, even if the size of the solder balls are reduced.

Further, in operating an electronic device comprising a semiconductor chip and a circuit board coupled to each other by bumps, heat is generated in the electronic circuits of the electronic device and the semiconductor chip and the circuit board are deformed. The difference in coefficient of thermal expansion between the semiconductor chip and the circuit board causes a difference between the amount of deformation of the semiconductor chip and that of the circuit board, thereby causing a stress in the metal bumps coupling the semiconductor chip and the circuit board to each other. Repetitive exertion of stress on the metal bumps progressively accumulates the fatigue of the metal bumps and leads to the problem of a reduced durability or reliability of at least a portion of the metal bumps. The stress exerted on the metal bumps is comparatively low in the central area of the circuit board and comparatively high in the outer peripheral area thereof. The metal bumps located in the outer peripheral area, therefore, tend to be reduced in durability and reliability.

SUMMARY OF THE INVENTION

The object of the present invention is to provide a method of forming small bumps by which metal balls protrude to a greater extent with respect to the size thereof, and thus smaller bumps can be securely formed and an electronic apparatus including a device having the bumps formed by such a method.

Another object of the present invention is to provide a bump-forming method and an electronic device by which the durability and reliability of metal bumps can be improved.

A bump-forming method, according to the present invention, comprises the steps of filling cavities of a first plate with metal paste by squeegeeing, filling cavities of a second plate arranged in a mirror symmetry relationship with the cavities of the first plate with metal paste by squeegeeing, setting the first plate and the second plate in a facing relationship to each other with the cavities of the first plate and the cavities of the second plate located in registry with each other; heating the first and second plates to form metal balls in the cavities in one of the first and second plates, moving one of the first and second plates relative to the other of the first and second plates; and transferring the metal balls in the cavities in one of the first and second plates to a device to which bumps are to be formed.

The metal paste is composed of metal powders such as solder particles and flux, for example, and is inserted in the cavities of the first and second plates by squeegeeing. The surface of the solder paste is flush with the surfaces of the first and second plates, respectively, so that a predetermined amount of solder paste is inserted in each of the cavities. Then, the first and second plates are superposed one on the other and heated, with the result that the metal powders in the metal paste are molten and rounded into metal balls.

Since the cavities of the first plate are located in registry with the cavities of the second plate, the molten metal component of the metal paste in each of the cavities of the first plate is merged with the molten metal component of the metal paste in the corresponding one of the cavities of the second plate thereby to form a single metal ball. The metal balls are located in the cavities in one of the first and second plates with the tops thereof protruded out of the cavities, respectively. One plate is moved away from the other. The metal balls located in the cavities in one of the first and second plates are transferred to a device to which bumps to be formed.

According to the present invention, the amount of the metal paste in one of the cavities of the first plate plus the amount of the metal paste in one of the cavities of the second plate is equal to the amount of metal paste required to form one metal ball. Specifically, the total of the volume of a cavity of the first plate and the volume of a cavity of the second plate is equal to the volume required to form one metal ball. The metal balls are finally held in the cavities in one of the first and second plates. Each metal ball thus held has a larger volume than a particular cavity in which it is held. Consequently, each metal ball, while being held in the cavity, has the top thereof protruded considerably from the surface of the plate.

In transferring the metal balls from the plate to a device to which bumps are be formed, the metal balls come into contact with the electrode pads of the device, with a comparatively large gap maintained between the particular plate and the device. In other words, the metal balls can be transferred while maintaining a larger gap between the plate and the device to which bumps are be formed with bumps than that in the prior art.

Therefore, even if the wiring of the device to which bumps are be formed is formed at an increased density with narrower pitches, the metal balls are securely transferred from the plate to the device, while at the same time, damage of the surface of the semiconductor chip and attachment of foreign matter to the wiring of the semiconductor chip are prevented.

Preferably, the first and second plates are superposed one on the other vertically. Metal balls are thus formed in the cavities of the lower plate.

Preferably, before superposing the first and second plates, one of them is heated to form metal balls in the cavities thereof. The plate in which metal balls have not been formed is superposed above the plate in which metal balls were formed, and the assembly is then heated to form merged metal balls.

Preferably, the first and second plates are made of silicon, and the cavities are formed in the silicon plates by anisotropic etching. As an alternative, the first and second plates are made of photosensitive glass with the cavities formed in the photosensitive glass by etching. As another alternative, the first and second plates are formed in such a way that replicas having projection are formed on a plate having cavities by plating, and the first and second plates formed by molding using the replicas.

Preferably, the melting point of the metal powders in the metal paste filled in the cavities of one of the first and second plates is higher than that of the metal powders of the metal paste filled in the cavities of the other plate. As a result, it is possible to form metal balls of a composite structure with a core having a high melting point and an outer peripheral portion of a low melting point.

Further, according to the present invention, there is provided an electronic device including a device having bumps formed by the bump-forming method described above.

According to another aspect of the present invention, there is provided a bump-forming method comprising the steps of preparing a plate having a plurality of cavities, the cavities in the outer peripheral area being smaller than the cavities in the central ones; filling the cavities of the plate with metal paste by squeegeeing; heating the plate to form metal balls in the cavities; and moving the plate toward a first device to which bumps are to be formed to transfer the metal balls in the plate cavities to the first device.

The metal paste is composed of metal powders such as solder powders and flux, for example, and inserted in the plate cavities by squeegeeing. The surface of the solder paste is flush with the surface of the plate, so that the solder paste of an amount equal to the volume of a cavity is filled in each cavity. When the plate is heated, the metal powders in the metal paste are molten into round balls. The metal balls in the plate cavities are transferred to the device to which bumps are to be formed.

Since the cavities in the outer peripheral area of the plate are smaller than the cavities in the central area thereof, the metal balls formed in the cavities in the outer peripheral area are smaller than the metal balls formed in the cavities in the central area. As a result, the bumps formed in the outer peripheral area of the device are smaller than those formed in the central area thereof. A first device (first electronic member) to which bumps are to be formed is coupled to a second device (second electronic member), using the bumps thereby to form an electronic device. The bumps located in the central area are large and pressed to a comparatively large degree, while the bumps located in the outer peripheral area are small and pressed to a comparatively small degree. Consequently, even if stress is exerted on the bumps while the electronic device is in use, the fatigue of the small bumps in the peripheral area is comparatively small. As a result, the durability and reliability of the small bumps located in the peripheral area are improved.

Preferably, the plate is made of silicon and the cavities are formed in the silicon plate by anisotropic etching. As an alternative, the plate is made of the photosensitive glass, and the cavities are formed in the photosensitive glass by etching.

Preferably, the first and second plates are formed in such a way that replicas having projections are formed on a plate having cavities by plating, and the first and second plates are formed by molding using the replicas.

Further, according to the present invention, there is provided an electronic device comprising a first electronic part and a second electronic part coupled together by metal bumps, the metal located in the bumps located in the outer peripheral area being smaller than the metal bumps central area. Also in this case, as in the aforementioned case, the durability and reliability of the bumps located in the peripheral area are improved.

Preferably, the metal bumps in the outer peripheral area are formed in a pincushion shape.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1A:
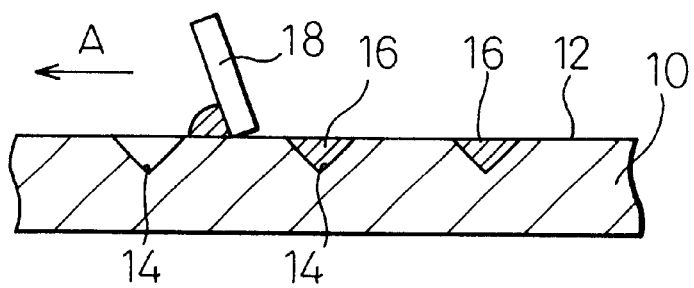
FIGS. 1A to 1E are views illustrating a bump-forming method according to the first embodiment of the present invention.
Figure 1B:
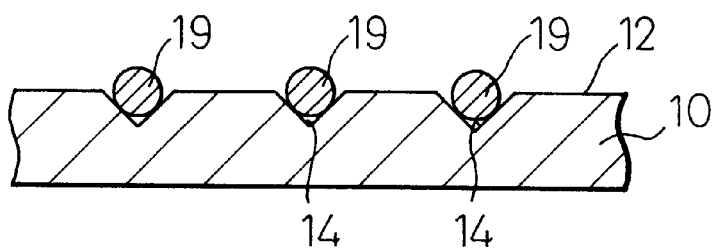
Figure 1C:
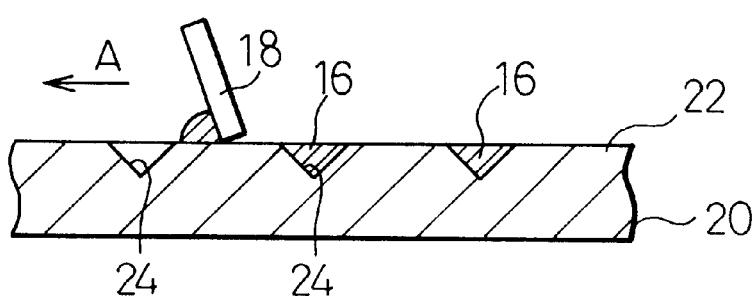
Figure 1D:
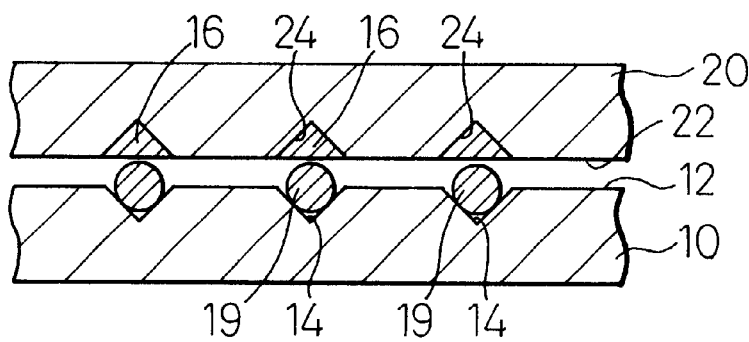
Figure 1E:
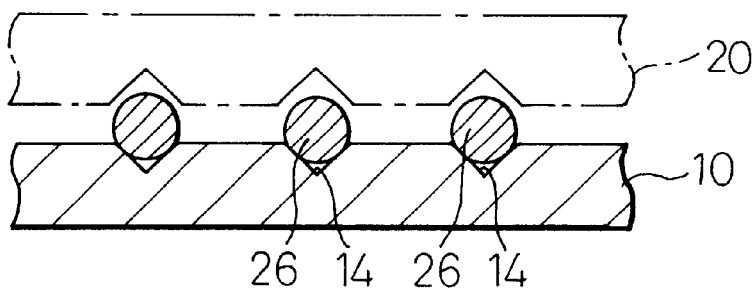
Figure 2A:
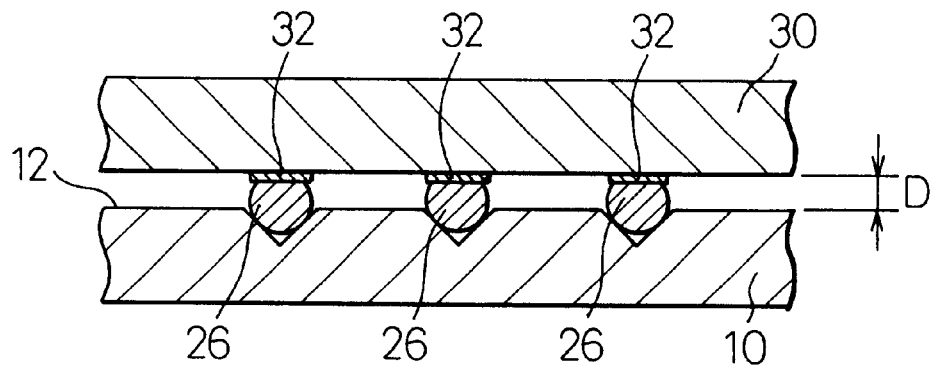
FIGS. 2A to 2C are views illustrating the steps following the step of FIGS. 1E.
Figure 2B:
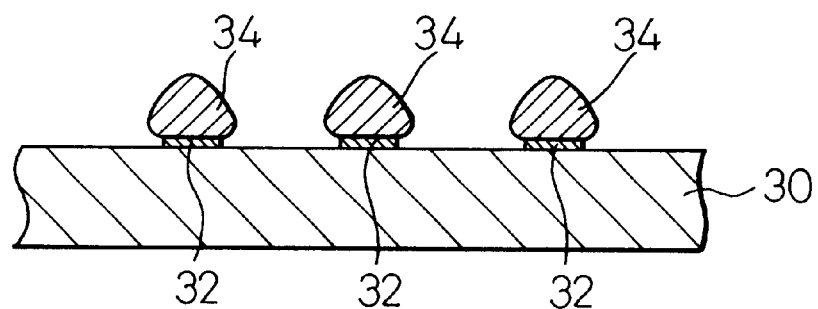
Figure 2C:
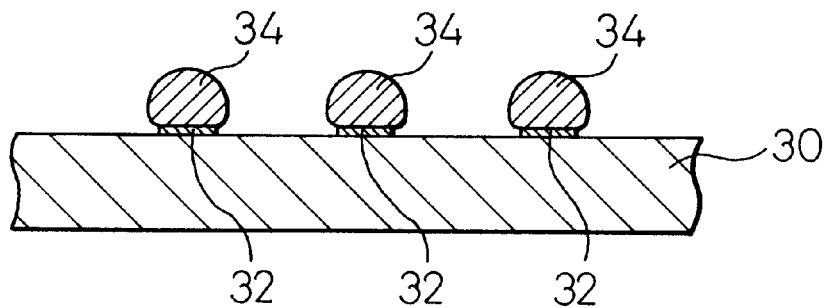

FIGS. 1A to 2C are views illustrating a method of forming bumps according to the first embodiment of the invention. FIGS. 1A to 1E show the process from the start thereof to the step of forming metal balls, and the FIGS. 2A to 2C show the process of transferring metal balls and the step of shaping the metal balls.

In FIG. 1A, a first (bump-forming) plate 10 having a surface 12 with a plurality of cavities 14 formed therein is prepared, and the cavities 14 are filled with metal paste 16 by squeegeeing, while moving a squeegee 18 in the direction of the arrow A. The metal paste 16 is composed of metal powders such as solder powders and flux. The squeegeeing operation renders the surface of the solder paste 16 flush with the surface 12 of the first plate 10, so that a predetermined amount of solder paste 16 is inserted in each cavity 14. The cavities 14 are formed at positions corresponding to the electrode pads of a circuit board or a semiconductor chip to which bumps are to be formed.

In FIG. 1B, the first plate 10 is heated, and the metal powders in the metal paste 16 are molten and rounded into metal balls 19 by surface tension. The flux component in the metal paste 16 are partly evaporated and partly remain nonvolatile in the cavities 14. The nonvolatile portion holds the metal balls 19 in the cavities 14.

In FIG. 1C, a second (bump-forming) plate 20 having a surface 22 with cavities 24 formed therein is prepared, and the cavities 24 are filled with metal paste 16. The cavities 24 of the second plate 20 are arranged in a mirror symmetry relationship with the cavities 14 of the first plate 10. In this embodiment, the volume of the cavity 24 is equal to that of the cavity 14. The cavities 24 are filled with the metal paste 16 by squeegeeing using a squeegee 18. The squeegeeing operation renders the surface of the solder paste 16 flush with the surface 22 of the second plate 20, so that a predetermined amount of solder paste 16 is inserted in each cavity 24. The metal paste 16 of FIG. 1C may or may not be identical to the metal paste 16 of FIG. 1A.

Note that the step of FIG. 1C can be executed before or at the same time as the steps of FIGS. 1A and 1B.

In FIG. 1D, the first plate 10 and the second plate 20 are placed in a facing relationship to each other, with the cavities 14 of the first plate 10 located in registry with the cavities 24 of the second plate 20. Under this condition, a slight gap remains between the surface 12 of the first plate 10 and the surface 22 of the second plate 20.

In FIG. 1E, the first and second plates 10, 20 are heated to form metal balls 26 in the cavities 12 in one of the first and second plates 10. With a high-temperature solder, the assembly is heated to about 350° C. In this embodiment, the first plate 10 having the metal balls 19 formed in advance is located under the second plate 20. Thus, the metal component of the metal paste 16 in the cavities 24 of the second plate 20 are molten and flow down onto the metal balls 19 of the lower first plate 10, with part thereof entering the cavities 14 of the first plate 10. The metal balls 19 in the first plate 10 are molten but have a substantially round shape. The molten metal that has flowed down from the cavities 24 of the second plate 20 attach to the outer circumference portion of the metal balls 19 in the first plate 10 and thus form the metal balls 26 having the increased size.

As described above, since position of the cavities 14 of the first plate are in registry with position of the cavities 24 of the second plate 20, a metal ball to be formed in a cavity 14 of the first plate 10 and a metal ball to be formed in a facing cavity 24 of the second plate 20 are merged into a single metal ball 26. The metal ball 26 is located in the cavity 14 of the plate 10 with the top thereof protruded upward.

Then the upper second plate 20 is moved away from the lower first plate 10. The metal balls 26 are held at substantially regular positions in the cavities 14 of the lower plate 10.

In FIG. 2A, a device 30 to which bumps are to be formed is pushed toward the first plate 10 while they are heated to transfer the metal balls 26 located in the cavities 14 of the first plate 10 to the device 30. The heating temperature is about 280° C., by which the metal balls 26 are not completely molten but the flux is molten to facilitate the transfer of the metal balls 26. The device 30 to which bumps are to be formed has electrode pads 32 at positions corresponding to the cavities 14, so that the metal balls 26 attach to the electrode pads 32. The first plate 10 and the device 30 are then heated in a nitrogen environment at about 350° C., so that the metal balls 26 are securely fused to the electrode pads 32. The first plate 10 is then moved away from the device 30.

FIG. 2B shows metal bumps 34 formed in this way, and FIG. 2C shows the metal bumps 34 which are heated again to shape the metal bumps 34 to an appropriate shape.

The device 30 to which bumps are to be formed is a semiconductor chip, for example, and the device 30 having the metal bumps 34 formed thereon can be then mounted to a circuit board by the metal bumps 34. The device 30 to which bumps are to be formed is not limited to a semiconductor chip but can be any device requiring bumps, such as a BGA (ball grid array) or a circuit board.

In FIG. 2A, when transferring the metal balls 26 from the first plate 10 to the device 30 to which bumps are to be formed, the urging pressure is set in such a manner that a gap D remains between the first plate 10 and the device 30. A proper gap D varies with the extent of the metal balls 26 protruding from the surface 12 of the first plate 10.

According to this invention, the sum of the amount of the metal paste in one cavity 14 of the first plate 10 and the amount of the metal paste in one cavity 24 of the second plate 20 equals the amount of the metal paste required to form one metal ball 26. In other words, the sum of the volume of one cavity 14 of the first plate 10 and the volume of one cavity 24 of the second plate 20 is equal to the volume required to form one metal ball 26. Consequently, the metal balls 26 finally held in the cavities 14 of the first plate 10 are protruded to a considerably greater extent from the surface 12 of the first plate 10.

Therefore, when transferring the metal balls 16 from the first plate 10 to the device 30 to which bumps are to be formed the metal balls 26 come into contact with the electrode pads 32 of the device 30 with a comparatively wider gap D left between the first plate 10 and the device 30. In other words, the metal balls 26 can be transferred with a wider gap D left between the first plate 10 and the device 30 than in the prior art.

Therefore, if the wiring of the device 30 is arranged at an increased density with narrower pitches, the metal balls 26 are securely transferred from the first plate 10 to the device 30, and the damage of the surface of the semiconductor chip and the attachment of the foreign matter to the wiring of the semiconductor chip are prevented.

The device 30 having the metal bumps 34 formed in this way is then mounted to another device such as a circuit board, using the metal bumps 34, to thereby constitute an electronic device including the device 30 with bumps.

FIGS. 3A to 3D are views illustrating a method of forming bumps according to the second embodiment of the present invention.

Figure 3A:
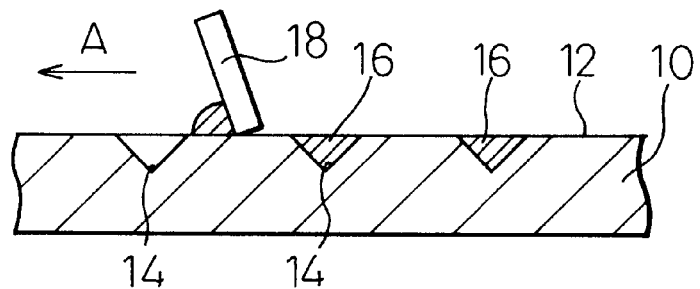
FIGS. 3A to 3D are views illustrating a bump-forming method according to the second embodiment of the present invention.

In FIG. 3A, a first (bump-forming) plate 10 having a surface 12 with cavities 14 formed therein is prepared, and the cavities 14 are filled with metal paste 16 by squeegeeing using a squeegee 18. In this embodiment, the metal balls 19 are not formed in the first plate 10, which was shown in FIG. 1B. However, in some cases, it is preferable to form the metal balls 19 in advance to facilitate the positioning the first plate 10 and the second plate 20 in a facing relationship to each other.

Figure 3B:
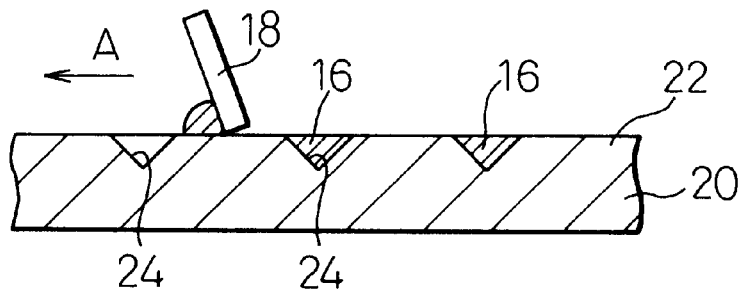

In FIG. 3B, a second (bump-forming) plate 20 having a surface 22 with cavities 24 is prepared, and the cavities 24 are filled with metal paste 16. The cavities 24 of the second plate 20 are arranged in a mirror symmetry relationship with the cavities 14 of the first plate 10. The cavities are filled with the metal paste 16 by squeegeeing using a squeegee 18. As a result of squeegeeing, the surface of the solder paste 16 is rendered flush with the surface of the second plate 20, so that a predetermined amount of the solder paste 16 is inserted in each cavity 24. The step of FIG. 3B can be executed before, after or at the same time as the step of FIG. 3A.

Figure 3C:
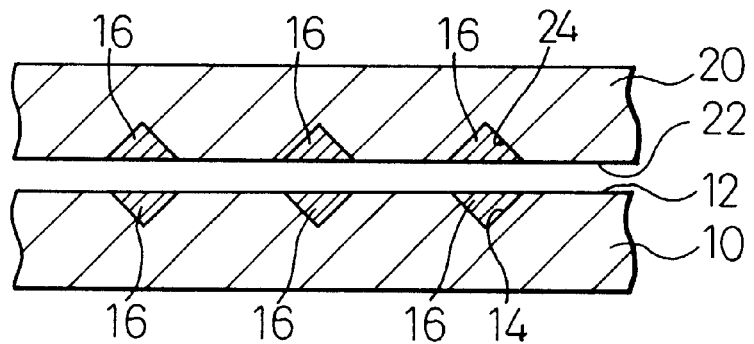

In FIG. 3C, the cavities 14 of the first plate 10 are located in registry with the cavities 24 of the second plate 20, and the first plate 10 and the second plate 20 are brought into a facing relationship to each other. Under this condition, the first and second plates 10, 20 are heated so that metal balls 26 are formed in the cavities 12 of the lower first plate 10. In this case, the metal balls 19 shown in FIG. 1B do not exist, but the molten metal component of the metal paste 16 in each cavity 14 of the first plate 10 and the molten metal component of the metal paste 16 in a corresponding cavity 24 of the second plate 20 are merged to form one metal ball 26.

Figure 3D:
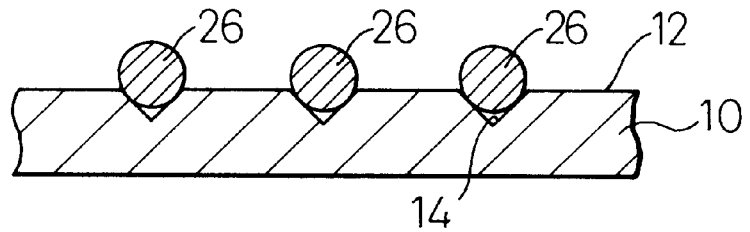

In FIG. 3D, the upper second plate 20 is moved away from the lower first plate 10, and the metal balls 26 are located in the cavities 14 of the first plate 10 with the tops thereof protruded. Then, as shown in FIG. 2A, the metal balls 26 are transferred from the first plate 10 to the device 30 to which bumps are to be formed. The device 30 having the metal bumps 34 formed in this way is mounted to another device such as a circuit board using the metal bumps 34. An electronic device including the device 30 having bumps is thus constructed.

Figure 4:
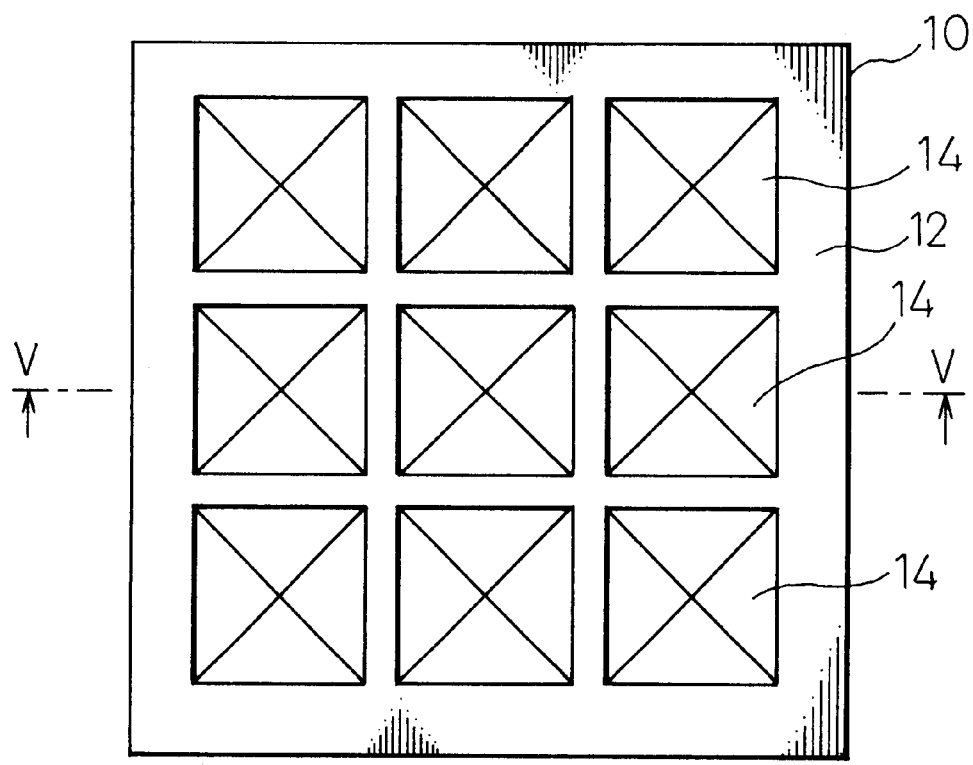
FIG. 4 is a plan view showing an example of the plate of FIGS. 1A to 3D.
Figure 5:
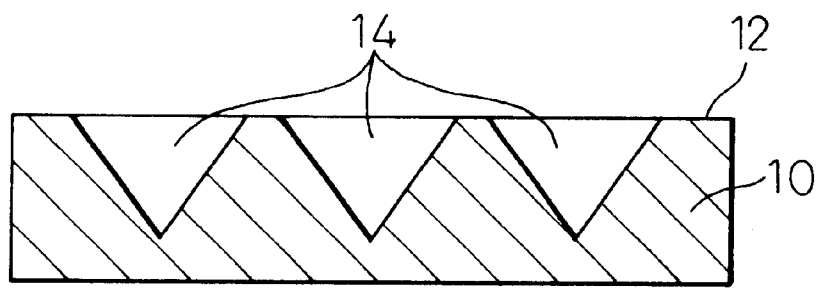
FIG. 5 is a cross-sectional view taken along the line V—V of FIG. 4.

FIG. 4 is a plan view illustrating an example of the first plate 10 (and the second plate 20) of FIGS. 1 to 3. FIG. 5 is a cross-sectional view taken along the line V—V in FIG. 5. In this case, the first plate 10 (and the second plate 20) is made of a silicon plate with the surface 12 coinciding with the <100>crystallographic plane, and the cavities 14 are formed in the surface 12 by anisotropic etching, with a mask having square openings. The cavities 14 are shaped in a regular rectangular pyramid.

Figure 6:
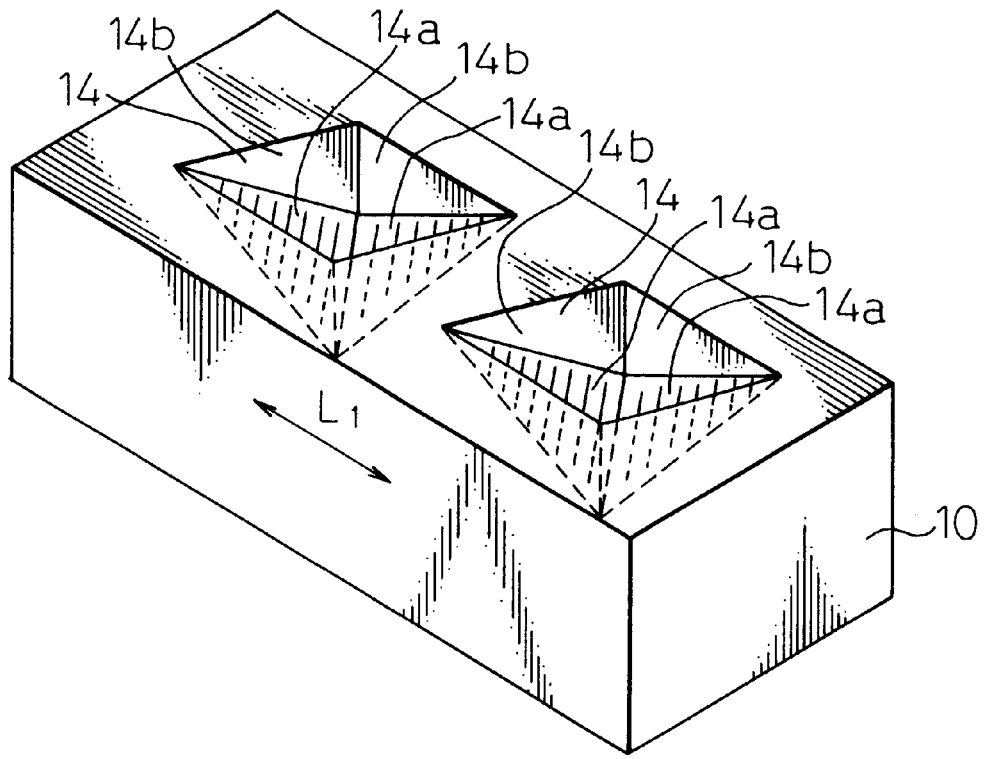
FIG. 6 is a perspective view showing another example of the plate of FIGS. 1A to 3D.

FIG. 6 is a perspective view illustrating another example of the first plate 10 (and the second plate 20) of FIGS. 1 to 3, and FIG. 7 is a diagram explaining the cavity of the plate of FIG. 6.

In this example, the first plate 10 (and the second plate 20) is made of a silicon plate having the surface 12 coinciding with the <110>crystallographic plane, and the cavities 14 are formed in the surface 12 by anisotropic etching, with a mask having rhombic openings. Each cavities 14 has a rhombic opening with a bottom surface 14$a$ formed at an angle to the surface 12 and four side surfaces 14$b$ substantially perpendicular to the surface 12.

In the case where the first plate 10 (and the second plate 20) is formed of silicon and the cavities 14 are formed by anisotropic etching in this way, a multiplicity of minuscule cavities 14 (24) can be formed accurately. For example, the diameter of the metal balls 26 is 70 to 100 $\mu$m, and the pitch of the cavities 14 (24) is 150 to 200 $\mu$m. The first plate 10 (and the second plate 20) having these cavities can be fabricated with a high reproducibility. The volume of the cavities 14 (24) formed in the silicon plate by anisotropic etching with the surface 12 coinciding with the <110>crystallographic plane is greater than the volume of the cavities 14 (24) formed in the silicon plate by anisotropic etching with the surface 12 coinciding with the <100>crystallographic plane, supposing that the area of the opening of the former cavity is the same as that of the latter cavity.

Figure 8:
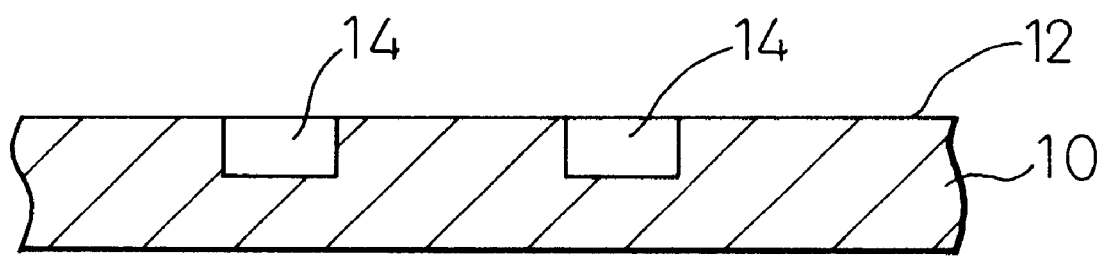
FIG. 8 is a cross-sectional view showing another example of the plate of FIGS. 1A to 3D.

FIG. 8 is a cross-sectional view showing another example of the first plate 10 (and the second plate 20) of FIGS. 1 to 3. The first plate 10 (and the second plate 20) is made of photosensitive glass, and the cavities 14 are formed in the photosensitive glass by etching.

Figure 7:
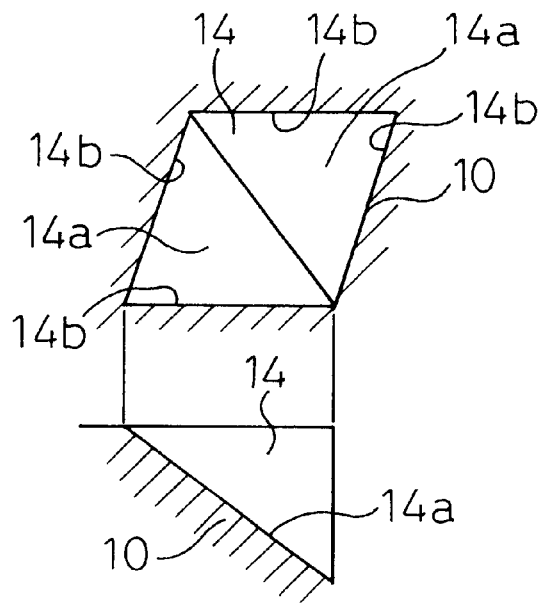
FIG. 7 is a diagram showing a cavity of the plate of FIG. 6.

According to this invention, the plate of FIGS. 4 and 5, the plate of FIGS. 6 and 7 and the plate of FIG. 8 can be used as to produce the first plate 10 and the second plate 20 in an appropriate combination.

Further, according to the present invention, the plate of FIGS. 4 and 5, the plate of FIGS. 6 and 7, and the plate of FIG. 8 can be used as a die for fabricating a replica, and the first and the second plates 10 and 20 can be molded using this mold.

Figure 9A:
FIGS. 9A to 9E are views showing another example of the plate of FIGS. 1A to 3D.
Figure 9B:
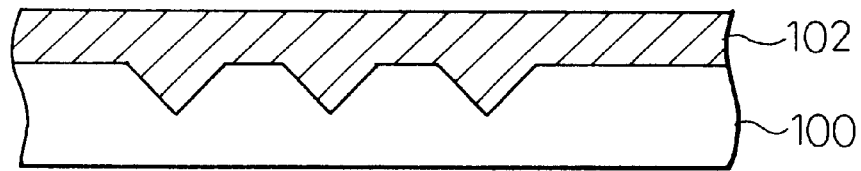
Figure 9C:
Figure 9D:
Figure 9E:
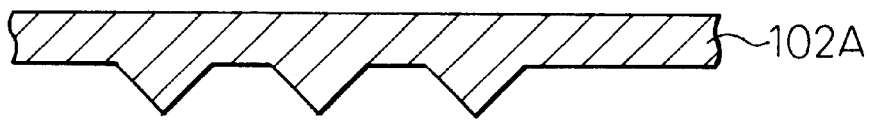
Figure 9E:
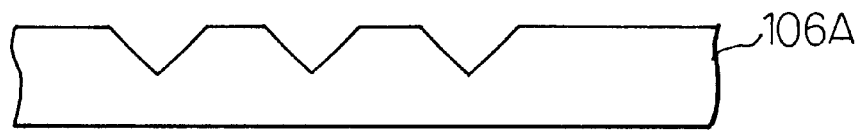

For example, in FIG. 9A, the numeral 100 designates a plate corresponding to the plate 10 shown in FIGS. 4 to 8. In FIG. 9B, a metal layer of Nickel 102 is formed on the plate 100 by plating or the like. In FIG. 9C, the plate 100 is removed from the metal layer 102, to form a replica die 102A having projections 104 complementary with the cavities of the plate 100. In FIG. 9D, a further metal layer of Nickel 106 is formed on the replica die 102A to a required thickness by plating or the like, again. In FIG. 9E, the replica die 102A is removed from the further metal layer 106, and the further metal layer 106 is subjected to a post-processing shaping to complete a (replica) plate 106A which has the identical shape and pattern to those of the plate 100. This plate 106A can be used as the first and the second plates 10 and 20.

Table 1 below shows the first example and a first comparison (comparative example) for forming metal balls 26 having a diameter of 100 μm. In the first example, the cavities 14 of the first plate 10 and the cavities 24 of the second plate 20 both have rhombic openings of FIGS. 6 and 7 and are the same in size. In the first comparison, metal balls 100 μm in diameter are formed in one step using a single plate having cavities with similar rhombic openings. Units are expressed in μm. The "cavity side length" indicates the length of a side of the rhombic opening.

TABLE 1

|  | Cavity side length | Cavity depth | Ball protrusion | Gap D |
| --- | --- | --- | --- | --- |
| Comparison 1 | 165 | 97 | 37 | 15 |
| Example 1 | 131 | 77 | 57 | 35 |

According to the first example, the ball protrusion (the extent of the protruding portions of the metal balls a above the surface of the plate) is larger by 20 μm than the comparison 1 and the gap D formed at the time of transfer under pressure has increased from 15 μm to 35 μm.

Table 2 below, in a similar manner to Table 1, shows the second example and a second comparison in which the cavities 14, 24 have square openings as shown in FIGS. 4 and 5.

TABLE 2

|  | Cavity side length | Cavity depth | Ball protrusion | Gap D |
| --- | --- | --- | --- | --- |
| Comparison 2 | 194 | 137 | 29 | 7 |
| Example 2 | 154 | 109 | 57 | 35 |

FIGS. 10A to 10E are views illustrating a bump-forming method according to the third embodiment of the invention. This embodiment is fundamentally similar to the embodiment of FIGS. 1A to 1E, and will be explained briefly. In this embodiment, the cavities 14 of the first plate 10 have square openings shown in FIGS. 4 and 5, and the cavities 24 of the second plate 20 have rhombic openings as shown in FIGS. 6 and 7. The cavities 24 having rhombic openings as shown in FIGS. 6 and 7 are shallow compared with the cavities 14 having square openings shown in FIGS. 4 and 5, and have a superior die-releasing characteristics to the metal paste 16. The cavities 24, therefore, are desirably placed above the cavities 14 when the plates are arranged in a facing relationship.

Figure 10A:
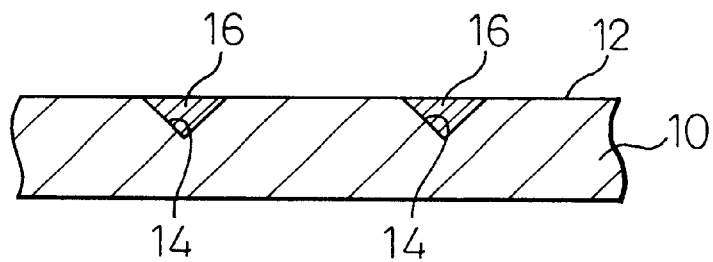
FIGS. 10A to 10E are views showing a bump-forming method according to the third embodiment of the present invention.
Figure 10B:
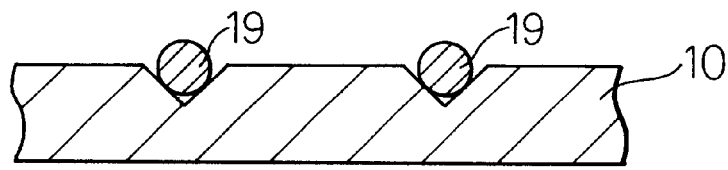
Figure 10C:
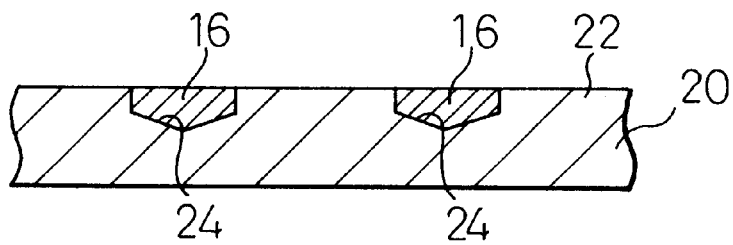
Figure 10D:
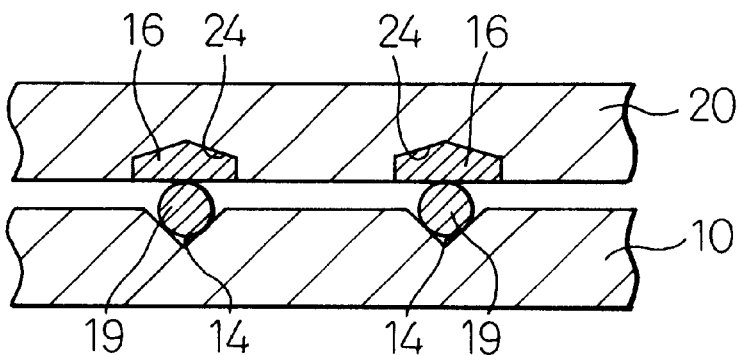
Figure 10E:
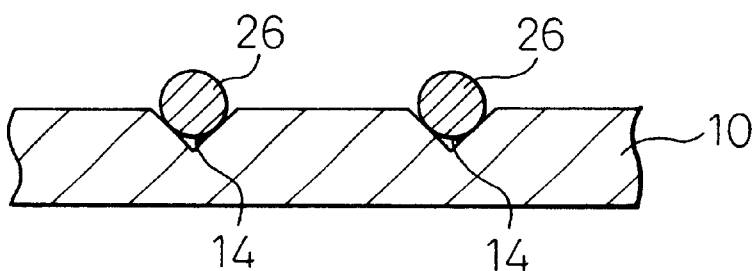

In FIG. 10A, the cavities 14 of the first (bump-forming) plate 10 are filled with the metal paste 16 by squeegeeing. In FIG. 10B, the first plate 10 is heated to form metal balls 19 in the cavities 14. Then, in FIG. 10C, the cavities 24 of the second (bump-forming) plate 20 are filled with the metal paste 16 by squeegeeing. In FIG. 10D, the cavities 14 of the first plate 10 and the cavities 24 of the second plate 20 are positioned in registry with each other and the plates 10 and 12 are superposed one on the other. Then, in FIG. 10E, the first and second plates 10, 20 are heated to form metal balls 26 in the cavities 12 of the first plate 10.

The upper second plate 20 is then moved away from the lower first plate 10 and a device 30 to which bumps are to be formed is pressed toward the first plate 10 while being heated to transfer the metal balls 26 in the cavities 14 of the first plate 10 to the device 30, as shown in FIG. 2A. After that, the device 30 such as a semiconductor chip having the metal balls formed thereon is mounted to another device such as a circuit board using the metal bumps, thus constituting an electronic device including the device 30 having the bumps.

FIGS. 11A to 11E are views illustrating a bump-forming method according to the fourth embodiment of the present invention. This embodiment is fundamentally similar to the embodiment of FIGS. 1A to 1E and will be briefly explained. The difference of this embodiment, however, lies in that the metal paste 16a inserted in the cavities 14 of the first plate 10 contains a high-temperature solder, and the metal paste 16b inserted in the cavities 24 of the second plate 20 contains a low-temperature solder.

Figure 11A:
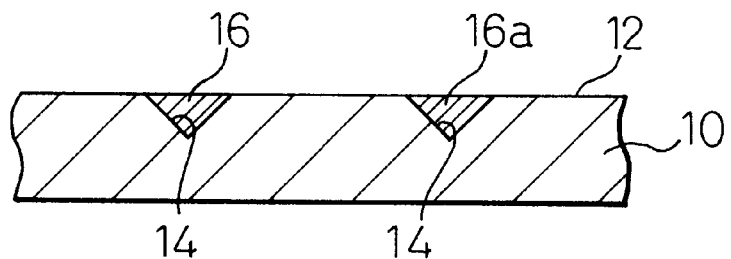
FIGS. 11A to 11E are views showing a bump-forming method according to the fourth embodiment of the present invention.
Figure 11B:
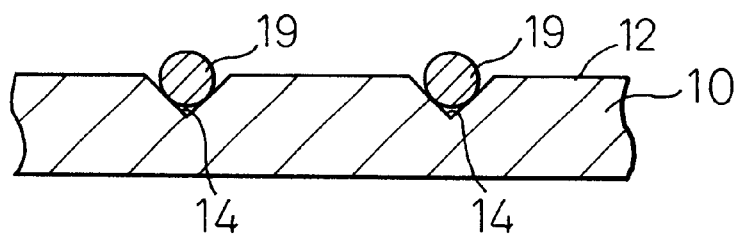
Figure 11C:
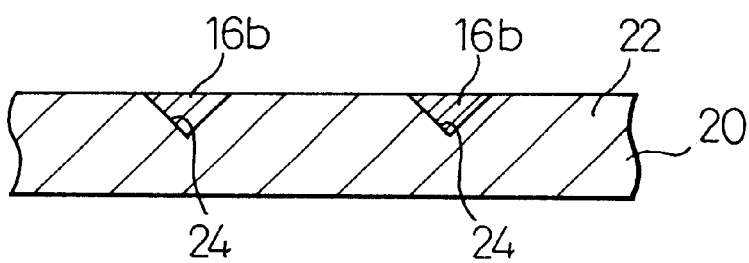
Figure 11D:
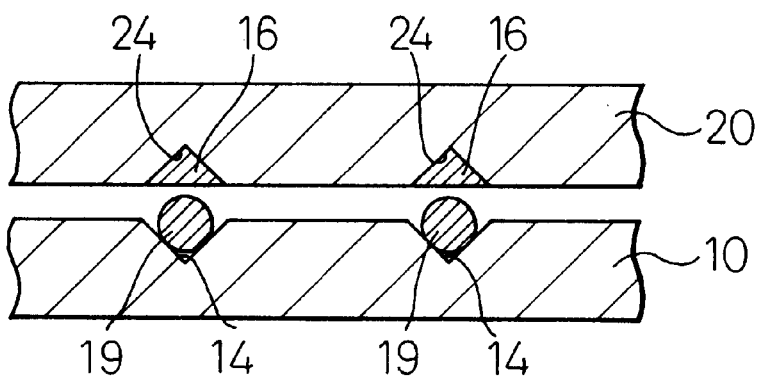
Figure 11E:
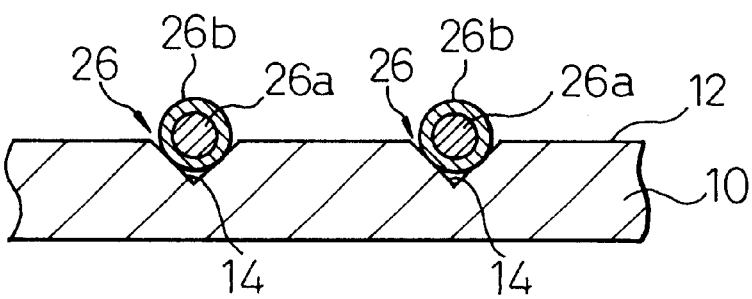

In FIG. 11A, the cavities 14 of the first (bump-forming) plate 10 are filled with the metal paste 16a by squeegeeing. In FIG. 11B, the first plate 10 is heated to form metal balls 19 in the cavities 14. Then, in FIG. 11C, the cavities 24 of the second (bump-forming) plate 20 are filled with the metal paste 16b by squeegeeing. In FIG. 11D, the cavities 14 of the first plate 1 are placed in registry with the cavities 24 of the second plate 20, and the first and second plates are superposed one above the other. In FIG. 11E, the first and second plates 10, 20 are heated to form metal balls 26 in the cavities 12 of the first plate 10.

The metal paste 16a inserted in the cavities 14 of the first plate 10 contains a solder of high melting point (such as Sn5/Pb5). The melting point of this solder is 300° C. on the solidus line and 315° on the liquidus line. The metal paste 16b inserted in the cavities 24 of the second plate 20 contains a solder of low melting point (such as Sn63/Pb37), which solder has an eutectic temperature of 183° C. For this reason, the assembly is heated desirably in a nitrogen atmosphere of about 200 to 250° C. in temperature in forming the metal balls 26 in FIG. 11E, compared to of at about 350° C. in forming the metal balls 19 in FIG. 11B. By so doing, a composite structure is produced in which the core 26a of the metal ball 26 is a high-temperature solder and the peripheral portion 26b is covered by the core 26a of a low-temperature solder.

The upper second plate 20 is moved away from the lower first plate 10. As shown in FIG. 2A, the device 30 to which bumps are to be formed is heated while being pressed toward the plate 10. In this way, the metal balls 26 located in the cavities 14 of the first plate 10 are transferred to the device 30. Subsequently, the device 30 such as a semiconductor chip formed with metal balls in this way is further mounted to another device such as a circuit board using the metal bumps. An electronic device including the device 30 having the bumps is thus produced. The use of the solder balls 26 as bump electrodes leads to an assembly of high mountability and high stress resistance.

FIGS. 12A to 12E are view illustrating a bump-forming method according to the fifth embodiment of the present invention.

Figure 12A:
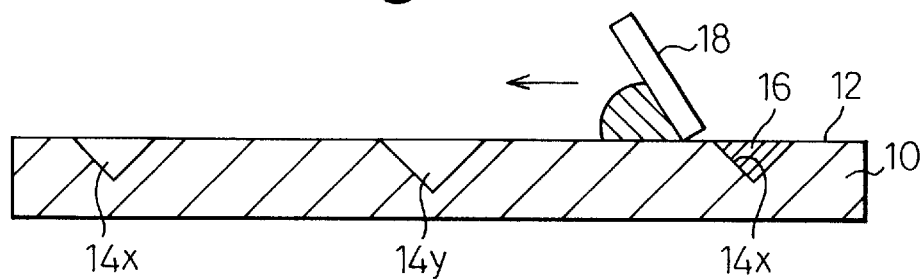
FIGS. 12A to 12E are views showing a bump-forming method according to the fifth embodiment of the present invention.

In FIG. 12A, a (bump-forming) plate 10 having a surface 12 with cavities 14x, 14y formed therein is prepared. According to this embodiment, the cavities 14x located in the outer peripheral area of the plate 10 are smaller than the cavities 14y located at the central area of the plate 10.

The cavities 14x, 14y are filled with metal paste 16 by squeegeeing while moving a squeegee 18 in the direction of arrow A. The metal paste 16 is composed of metal powders such as solder powders and a flux. As a result of squeegeeing, the surface of the solder paste 16 becomes flush with the surface of the first plate 10, so that the solder paste 16 in an amount corresponding to the volume of the cavities 14x, 14y is filled in the cavities 14x, 14y, respectively. The cavities 14x, 14y are formed at positions corresponding to the electrode pads of a semiconductor chip or a circuit board to which bumps are to be formed.

Figure 12B:
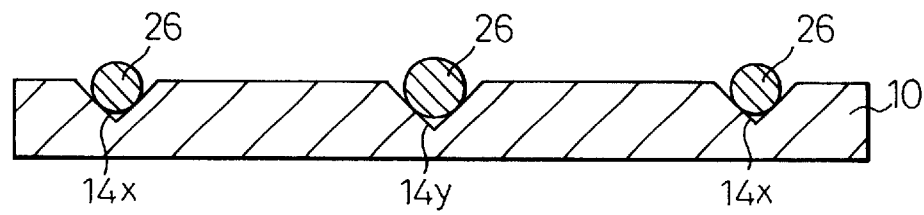

In FIG. 12B, the plate 10 is heated, and the metal powders in the metal paste 16 are molten and rounded into metal balls 26 by surface tension.

Figure 12C:
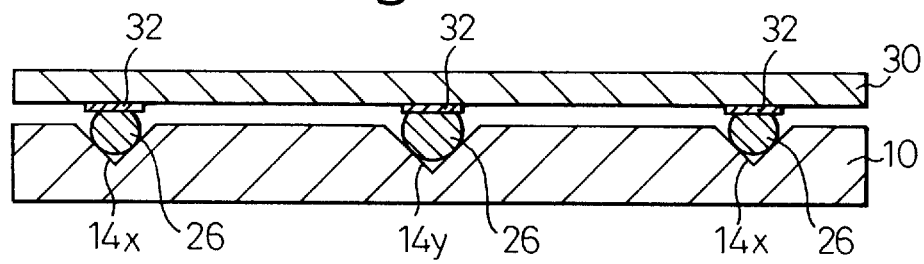
Figure 12D:
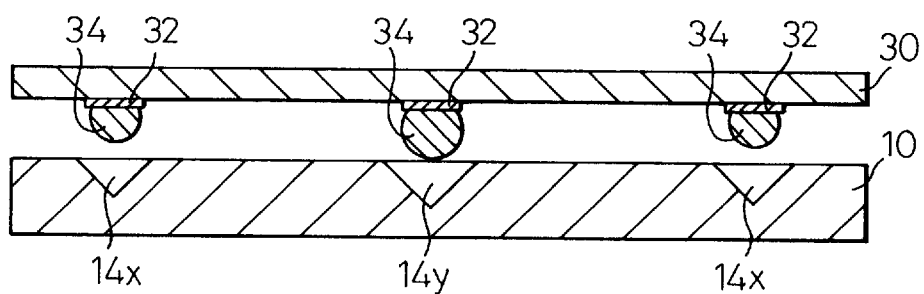

In FIG. 12C, the device 30 to which bumps are to be formed is pressed toward the plate 10 in the heated condition. Thus the metal balls 26 located in the cavities 14x, 14y of the plate 10 are transferred to the electrode pads 32 of the device 30. The cavities 14x, 14y of the plate 10 are formed at positions corresponding to the electrode pads 32 of the device 30, and therefore the metal balls 26 attach to the electrode pads 32, respectively. As shown in FIG. 12D, the plate 10 is moved away from the device 30. The metal balls 26 are thus transferred from the plate 10 to the device 30 and constitute bumps 34 of the device 30.

Figure 12E:
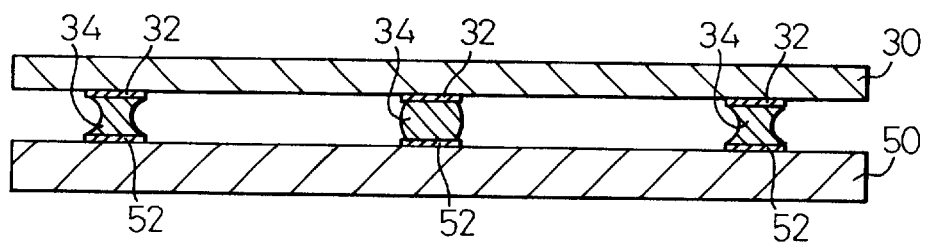

In FIG. 12E, the device 30 having the metal bumps 34 can be further mounted to the electrode pads 52 of the circuit board 50 by the metal bumps 34. The electrode pads 52 of the circuit board 50 are formed at positions corresponding to the metal bumps 34 of the device 30. The device 30 and the circuit board 50 are thus electrically and mechanically connected to each other by the metal bumps 34.

The device 30 to which bumps are to be formed with bumps is a semiconductor chip, for example. The device 30 to which bumps are to be formed with metal bumps, however, is not limited to the semiconductor chip, but can be any electronic part requiring bumps such as a BGA or a circuit board. Also, the device 30 having the metal bumps is not confined to the circuit board 50 but can be any electronic part.

According to this embodiment, the cavities 14x located in the outer peripheral area are smaller than the cavity 14y located in the central area of the plate 10. The metal balls 26 formed in the cavities 14x in the outer peripheral area is smaller than the metal ball 26 formed in the cavity 14y in the central area of the plate 10. Therefore, the bumps 34 formed in the outer peripheral area of the device 30 are smaller than those formed in the central area thereof. As shown in FIG. 12E, when the device 30 having the bumps 34 is coupled to the circuit board 50 using the bumps 34, the bumps 34 located in the central area are pressed and deformed to a comparatively large extent into the shape of a barrel. The small bumps 34 located in the outer peripheral area, on the other hand, are pressed and deformed to a comparatively small degree into the shape of a pincushion. Consequently, even in the case where stress is exerted on the bumps 34 while the electronic device including the device 30 and the circuit board 50 coupled to each other is in use, the fatigue of the small bumps located in the peripheral area is comparatively small. As a result, the durability and reliability of the small bumps 34 located on the peripheral portion are improved.

Figure 13:
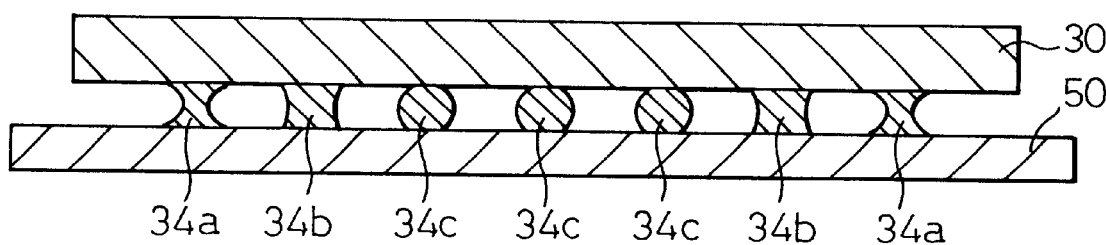
FIG. 13 is a view showing an electronic device produced according to the sixth embodiment of the present invention.

FIG. 13 is a view illustrating the sixth embodiment of the present invention. An electronic device comprising a device (semiconductor chip) 30 coupled to a circuit board 50 by flip-chip bonding is shown. Bumps 34a, 34b, 34c for coupling the device (semiconductor chip) 30 to the circuit board 50 are formed in three progressively descending sizes for every one third the area from the center of the chip. The bumps 34a located in the outer peripheral area are smallest (say, 80 $\mu$m), the bumps 34b located in the intermediate area are next smallest (say, 90 $\mu$m), and the bumps 34c located in the central area are largest (say, 100 $\mu$m). In this way, the bumps 34a, 34b, 34c are formed in progressively different sizes to accommodate the effect of thermal stress which increases progressively from the center to the outer periphery of the semiconductor chip. The size of the bumps 34a, 34b, 34c is determined of course by the size of the cavities 14x, 14y of the plate shown in FIGS. 12A to 12E.

Figure 14:
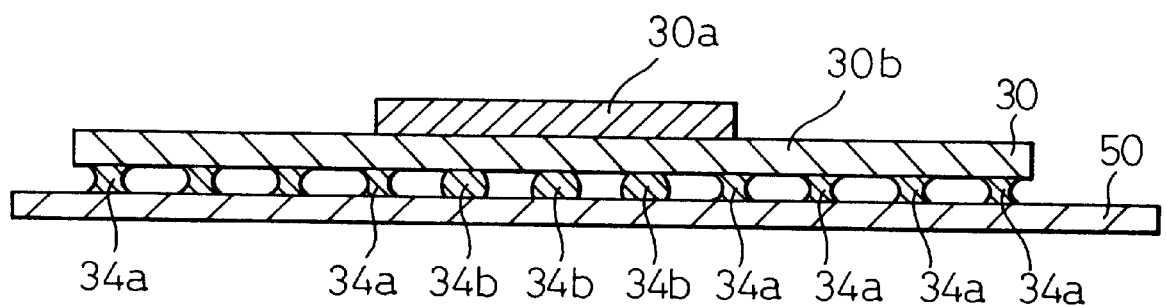
FIG. 14 is a view showing an electronic device produced according to the seventh embodiment of the present invention.

FIG. 14 is a view illustrating the a seventh embodiment of the present invention. This embodiment represents an example of mounting a BGA. The device 30 to which bumps are to be formed comprises a semiconductor chip 30a, and a substrate 30b to which the semiconductor chip 30a is mounted. Bumps 34a, 34b are arranged on the substrate 30b. The substrate 30b of the device 30 is coupled to a circuit board 50 by the bumps 34a, 34b. With this configuration, the bumps 34b just under the edges of the semiconductor 30a easily succumb to thermal stress. Therefore, the size of the bumps is differentiated by determining a boundary just under the edge of the semiconductor chip 30a. Specifically, the bumps 34a located just under and outside of the edges of the semiconductor chip 30a are formed to a comparatively small size (say, 450 $\mu$m), while the bumps 34b located inward of the portion just under the edges of the semiconductor chip 30a are formed to a comparatively large size (say, 600 $\mu$m). In this way, the effect of the thermal stress of the bumps located in the peripheral area is relaxed. The size of the bumps 34a, 34b is of course determined according to the size of the cavities 14x, 14y of the plate shown in FIGS. 12A to 12E.

This plate 10 can be made of silicon as shown in FIGS. 4 to 7 or glass as shown in FIG. 8. Also, the plate 10 can be made using the replica shown in FIGS. 9A to 9E.

As described above, according to the present invention, the increased protrusion of the balls from the surface of the plate reduces the positional variations of the metal balls (bumps), reduces a transfer failure (defect), increases the gap between the plate and the device such as a semiconductor chip during the transfer, and thus reduces the damage to the surface of the device by foreign matter which may be intruded in the gap. Further, the durability and reliability of the bumps of the electronic apparatus are improved.

What is claimed is:

1. A method of forming bumps comprising the steps of:

filling a plurality of cavities of a first plate with metal paste by squeegeeing, and filling a plurality of cavities of a second plate arranged in a mirror symmetry relationship with said cavities of said first plate with metal paste by squeegeeing;

setting said first plate and said second plate in a facing relationship with each other with said cavities of said first plate located in registry with said cavities of said second plate;

heating said first and second plates to form metal balls in said cavities in one of said first and second plates;

moving one of said first and second plates relative to the other of said first and second plates, and transferring the metal balls in said cavities in one of said first and second plates to a device on which bumps are to be formed.

2. A method of forming bumps as described in claim 1, in the step of superposing said first and second plates one on the other, said one of said first and second plates is arranged under said other of said first and second plates.

3. A method of forming bumps as described in claim 1, further comprising the step of heating one of said first and second plates to form metal balls in said plate, before superposing said first and second plates one on the other.

4. A method of forming bumps as described in claim 1, characterized in that said first and second plates are made of silicon, and said cavities are formed in the silicon plates by anisotropic etching.

5. A method of forming bumps as described in claim 1, characterized in that said first and second plates are made of photosensitive glass, and said cavities are formed in the photosensitive glass by etching.

6. A method of forming bumps as described in claim 1, characterized in that said first and second plates are formed in such a way that replicas having projections are formed on a plate having cavities by plating, and said first and second plates are formed by molding using said replicas.

7. A method of forming bumps as described in claim 1, characterized in that the melting point of the metal powders in the metal paste filled in the cavities of one of said first and second plates is higher than that of the metal powders in the metal paste filled in the cavities of the other of said first and second plates.

8. A method of forming bumps comprising the steps of:

disposing a metal core in cavities of a first plate;

filling a plurality of cavities of a second plate arranged in a mirror symmetry relationship with said cavities of said first plate with metal paste which has a lower melting point than the metal core;

setting said first plate and said second plate transferring the metal balls in said cavities in one of said first and second plates to a device on which bumps are to be formed in afacing relationship with each other so as to locate said cavities of said first plate on said cavities of said second plate; and heating said first and second plates to form metal balls having the metal core in the metal balls in said cavities in one of said first and second plates.

* * * * *

UNITED STATES PATENT AND TRADEMARK OFFICE
CERTIFICATE OF CORRECTION

PATENT NO.     : 6,271,110 B1
DATED          : August 7, 2001
INVENTOR(S)    : Yamaguchi et al.

It is certified that error appears in the above-identified patent and that said Letters Patent is hereby corrected as shown below:

<u>Title page</u>,
Item [63] Related U.S. Application Data, -- Continuation-in-part of application No. 08/516,284, filed on August 17, 1995, now Pat. No. 6,025,258, which is a continuation-in-part of application No. 08/374,429, filed on January 19, 1995, now abandoned. --

Signed and Sealed this

Second Day of April, 2002

*Attest:*

*Attesting Officer*

JAMES E. ROGAN
*Director of the United States Patent and Trademark Office*